(12) United States Patent
Takenaka et al.

(10) Patent No.: US 7,018,672 B2
(45) Date of Patent: Mar. 28, 2006

(54) CIRCUIT BOARD PRODUCING METHOD AND CIRCUIT BOARD PRODUCING DEVICE

(75) Inventors: Toshiaki Takenaka, Kyoto (JP); Toshihiro Nishii, Osaka (JP); Yuichiro Sugita, Osaka (JP); Shinji Nakamura, Osaka (JP); Hideaki Komoda, Osaka (JP); Toshikazu Kondo, Osaka (JP)

(73) Assignee: Matushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/182,632

(22) PCT Filed: Dec. 4, 2001

(86) PCT No.: PCT/JP01/10572

§ 371 (c)(1),
(2), (4) Date: Nov. 21, 2002

(87) PCT Pub. No.: WO02/47450

PCT Pub. Date: Jun. 13, 2002

(65) Prior Publication Data

US 2003/0138553 A1    Jul. 24, 2003

(51) Int. Cl.
*B05D 5/12* (2006.01)
*B05D 3/12* (2006.01)
*B41M 1/12* (2006.01)
*B41F 9/10* (2006.01)

(52) U.S. Cl. .................... 427/97.7; 427/356; 101/129; 101/157; 101/169

(58) Field of Classification Search .............. 101/127.1, 101/129, 123, 157, 169, 365; 427/58, 96, 427/97, 282, 355, 356, 97.7; 118/123–126, 118/413

See application file for complete search history.

(56) References Cited

U.S. PATENT DOCUMENTS

| | | | |
|---|---|---|---|
| 4,893,556 A | | 1/1990 | Hasegawa et al. |
| 5,761,803 A | * | 6/1998 | St. John et al. ............... 29/852 |
| 6,112,656 A | * | 9/2000 | Asai et al. .................. 101/123 |
| 6,139,904 A | | 10/2000 | Yamasaki et al. |
| 6,237,490 B1 | * | 5/2001 | Takahashi et al. .......... 101/129 |
| 6,347,583 B1 | * | 2/2002 | Isogai et al. ................ 101/126 |
| 6,395,335 B1 | * | 5/2002 | Onishi et al. ............... 427/282 |
| 6,494,133 B1 | * | 12/2002 | Ooe ........................... 101/123 |
| 6,553,905 B1 | * | 4/2003 | Miyahara et al. .......... 101/129 |

FOREIGN PATENT DOCUMENTS

JP    60-126891    7/1985

(Continued)

OTHER PUBLICATIONS

M. Tachibana et al. "Resin Based Multi-Layered Circuit Board Alivh", Surface Mount Technology. pp. 24-29, May 1996 (English abstract attached).

(Continued)

Primary Examiner—Brian K. Talbot
(74) Attorney, Agent, or Firm—RatnerPrestia

(57) ABSTRACT

A method of manufacturing multi-layer circuit board comprising: a hole forming step for forming through-holes or blind-holes in a plate-form or sheet-form board material, and a filling step for filling a paste into through-holes or blind-holes formed in the hole forming step by using a filling means. A second paste is supplied to the paste in the filling process by using a paste supplying means to stabilized a viscosity of the paste and the paste is reliably filled into the through-holes or the blind-holes.

21 Claims, 5 Drawing Sheets

FOREIGN PATENT DOCUMENTS

| | | | |
|---|---:|---|---|
| JP | 49293 | * | 3/1991 |
| JP | 4-247687 | | 9/1992 |
| JP | 04-247687 | * | 9/1992 |
| JP | 5-16327 | | 1/1993 |
| JP | 5-237986 | | 9/1993 |
| JP | 06-234204 | * | 8/1994 |
| JP | 6-268345 | | 9/1994 |
| JP | 268345 | * | 9/1994 |
| JP | 314799 | * | 12/1997 |
| JP | 11-145617 | | 5/1999 |
| JP | 2000-071419 A | | 3/2000 |
| JP | 2000-188472 | | 7/2000 |
| JP | 2000-299560 A | | 10/2000 |
| JP | 2000-309081 A | | 11/2000 |
| JP | 203437 | * | 7/2001 |

OTHER PUBLICATIONS

International Search Report corresponding to application No. PCT/JP01/10572 dated Feb. 26, 2002.

English translation of Form PCT/ISA/210.

European Search Report for EP 01 27 0088, dated Jul. 29, 2004.

* cited by examiner

PRIOR ART
FIG.5A
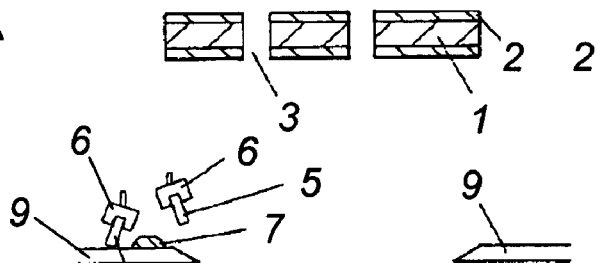
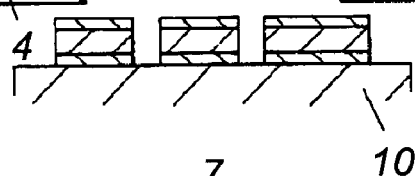
FIG.5B
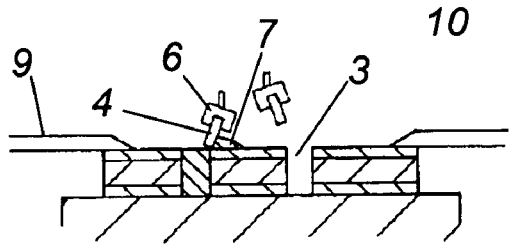
FIG.5C
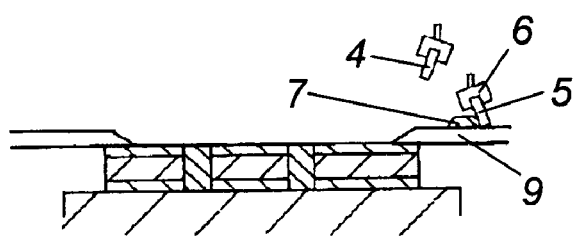
FIG.5D
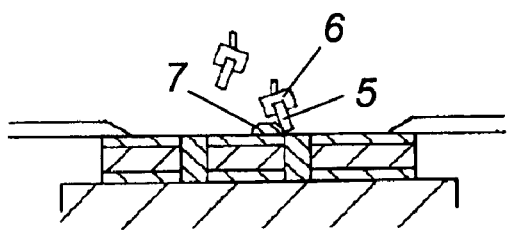
FIG.5E
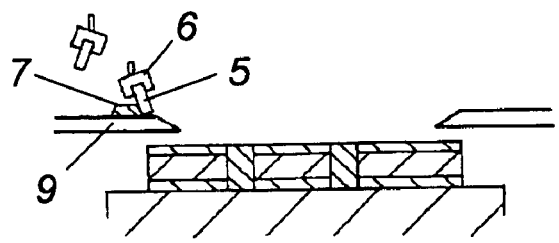
FIG.5F

CIRCUIT BOARD PRODUCING METHOD AND CIRCUIT BOARD PRODUCING DEVICE

This Application is a U.S. National Phase Application of PCT International Application PCT/JP01/10572.

TECHNICAL FIELD

The present invention relates to a method of manufacturing circuit boards used for various electronic equipment, and a circuit board manufacturing apparatus.

BACKGROUND ART

With a recent trend of electronic equipment becoming smaller in size and higher in density, double-sided circuit boards and multi-layer circuit boards are increasingly employed instead of conventional single-sided circuit boards on which electronic components are mounted, a development of a high-density circuit board capable of integrating as many circuits as possible on the circuit board is being made.

In a high-density circuit board, in place of a conventional method that has been widely employed for forming through-holes in a circuit board by drilling and making interstitial connection by a metal-plating, a method of manufacturing a circuit board having inner-via-structure capable of interstitial connection between wirings at the predetermined positions in higher density has been developed (for example, "Resin multi-layer circuit board ALIVH and its Application", Masa Tachibana et al., May 1996, Surface Mounting Technology (published by Nikkan Kogyo Shinbun); and Japanese Patent Laid-open Publication 6-268345).

In such newly developed circuit board having inner-via-structure, a method of filling conductive paste into holes formed between the wirings is employed in order to make the interstitial connection.

Also, in a so-called build-up circuit board that has realized interstitial connection by a metal-plating of inner-via holes, to form a via-on-via structure in which inner-via-holes are stacked in the direction of thickness of the circuit board, it is necessary to smoothen the surface of the circuit board by filling a resin material paste or the like into the holes after the metal-plating.

As described above, in the production of high-density circuit boards of recent years, it is important to have a technology of filling conductive paste into the through-holes or a blind-holes.

However, in a high-density circuit board, with decrease in width of wiring and in size of electrode land, the size of the through-hole or the blind-hole is also reduced, and as a result, it becomes indispensable to optimize the filling conditions and also to control the viscosity of the paste for the purpose of precisely filling the paste into the holes.

Also, in order to mount a high-density circuit board in portable equipment for private use or the like, it is important to reduce the manufacturing cost, and there has been a strong demand for a method of manufacturing where circuit boards of as many as possible are produced with same quantity of paste.

An example of paste filling process in a conventional method of manufacturing a circuit board will be described with reference to FIG. 5A to FIG. 5F.

Board material 1 shown in FIG. 5A is a B staged prepreg sheet of after impregnating woven or non-woven fabric based on inorganic or organic fiber material such as glass fiber or aramid fiber with thermosetting resin material such as epoxy resin or the like, and release films 2 are bonded to both surfaces of the board material 1.

Further, through-holes 3 are formed in the board material 1 by a high-speed and small size drilling process using a laser beam or the like.

As shown in FIG. 5B, the board material 1 is placed on stage 10 by means of a board material transfer device (not shown).

On frame 9 is disposed paste 7 prepared by dispersing copper-based conductive particles into a binder component consisting of epoxy resin, hardener, solvent and the like.

Next, as shown in FIG. 5C, the board material 1 is slightly pressed by the frame 9, and then the paste 7 on the frame 9 at left in the figure is squeezed to the right in the figure by forward squeegee 4 installed in squeegee holder 6 and is filled into through-holes 3.

A squeegee elevation mechanism (not shown) and a squeegee pressing mechanism (not shown) are connected to the squeegee holder 6.

As shown in FIG. 5D, the mode is shifted to backward squeegee 5 on the frame 9 at right in the figure.

Subsequently, as shown in FIG. 5E, the paste 7 is squeezed to the left by the backward squeegee 5 and is filled into the through-holes again.

Next, as shown in FIG. 5F, the paste filling operation is completed when the paste 7 reaches on the frame 9 at left in the figure, and then the frame 9 moves up and the board material 1 is carried out by a board material transfer device (not shown), thereby obtaining the board material 1 with the paste 7 filled in the through-holes 3.

After that, the board material 1 filled with the paste 7 goes to a process where the release film 2 is removed therefrom. Also, the board material 1 is sandwiched between metal foils or the like and subjected to a hot press process to become a circuit board.

FIG. 6 shows a partially enlarged sectional view of the board material 1 filled with the paste 7 and carried out by the board material transfer device.

As shown in FIG. 6, the paste 7 is filled into the through-holes 3, and the surface of release film 2 is almost entirely coated with the binder component 17 and a very small amount of conductive particles 16 contained in the paste 7.

Such phenomenon takes place probably because the conductive particles 16 in the paste 7 are nearly adequately removed by the forward squeegee 4, while the binder component 17 in a state of being thinly coated on the release film 2 is hard to be removed and is not completely scraped off by the forward squeegee 5, thus remaining on the release film 2.

As a result, when comparing the component of paste 7 shown in FIG. 5B and the component of paste 7 shown in FIG. 5F after completion of the filling operation the latter is less in the quantity of binder component 17 in the ratio of conductive particles 16 and binder component 17.

The change in quantity is very slight, but it increases as the filling operation is continuously repeated on many board materials 1, causing the paste 7 to increase in viscosity due to reduction in quantity of the binder component 17, and finally there occurs a problem such that the paste filled into the through-hole 3 is insufficient or the paste 7 sticks to the release film 2 when the release film 2 is removed.

In order to avoid the occurrence of such problem, it is necessary to replace the paste with new one before the viscosity of paste 7 reaches the limit.

When the filling operation is performed by supplying new paste onto the manufacturing apparatus, hereinafter, a number of board materials treated between the supplying of the paste and a replacement of the paste is called a printable number.

The operation for replacement of the paste includes a considerable labor for supplying new paste and removing the old paste from the equipment, and a timing of executing the replacement depends on the number of through-holes 3 provided in the board materials 1 or variations in viscosity of the initial paste. Thus, the timing is not constant and it is very difficult to decide to execute the operation after how many board materials are printed.

From the viewpoint of manufacturing costs, it is desirable to repeat the filling operation until the paste viscosity reach to a usable limit before replacing the paste. However, as described above, since the timing of replacement is not constant, the replacement operation of the paste is actually performed a little earlier to the limit to allow some margin to avoid quality trouble.

Also, in the conventional circuit board manufacturing method described above, the paste is given conductivity for the purpose of interstitial connection of wiring, and therefore, it is difficult to make an amount of conductive particles in the paste lower than a specific value from the viewpoint of maintaining a conductivity. As a result, the paste has an increased viscosity, and it is also difficult to employ a method of increasing the printable number only by lowering the viscosity of the paste itself.

Further, the filling conditions such as a moving speed and an angle of forward squeegee 4 and backward squeegee 5 are designed in accordance with the physical properties or the like of paste 7, but it is difficult to control the filling conditions since the viscosity of paste 7 varies during the filling operation on many board materials 1.

DISCLOSURE OF THE INVENTION

The present invention includes in a manufacturing process: a hole forming step where through-holes or blind-holes are formed in a plate-form or sheet-form board material, and a paste filling step where paste is filled into the through-holes or the blind-holes made in the hole forming step, wherein a second paste (hereafter called sub-paste) having the same compositon with or a different compositon from the paste is supplied to the paste by using a paste supplying means in the filling step.

According to the present invention, the sub-paste acts to stabilize the composition ratio and viscosity of the paste which vary during a plurality of the filling operation.

Also, the manufacturing apparatus of the present invention comprises a supplying operation controller for supplying a predetermined amount of sub-paste to the paste by using a paste supplying means for every predetermined number of board materials during continuous filling operation. Thus, it is possible to prevent the deterioration of filling quality due to a change in the number of holes in the board material or change in the viscosity of the paste and to provide a highly reliable high-density circuit board and to increase the printable number. As a result, the reduction of the manufacturing cost can be realized.

BRIEF DESCRIPTION OF THE DRAWINGS

FIG. 5A through FIG. 5F are sectional views showing the manufacturing steps in a conventional circuit board manufacturing method and apparatus.

DETAILED DESCRIPTION OF PREFERRED EMBODIMENTS

The preferred embodiments of the present invention will be described in the following with reference to FIG. 1A through FIG. 4.

First Preferred Embodiment

FIG. 1A through FIG. 1F are sectional views showing the manufacturing steps in a circuit board manufacturing method and apparatus in the first preferred embodiment of the present invention.

Figure 1A:
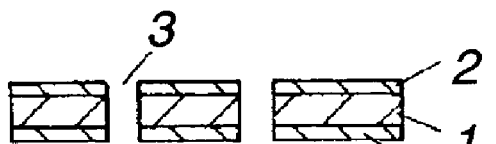
FIG. 1A through FIG. 1F are sectional views showing the manufacturing steps in a circuit board manufacturing method and apparatus in a first preferred embodiment of the present invention.

Board material 1 shown in FIG. 1A is a B staged prepreg sheet obtained by impregnating woven or non-woven fabric based on inorganic or organic fiber material such as glass fiber or aramid fiber with thermosetting resin material such as epoxy resin or the like, and release films 2 are bonded to both surfaces of the board material 1.

Also, fine through-hole 3 is formed in the board material 1 by a high-speed drilling using a laser beam or the like.

Figure 1B:
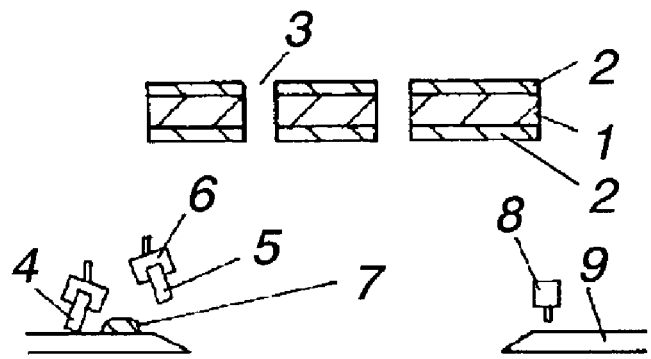

As shown in FIG. 1B, the board material 1 is transferred onto stage 10 by means of a board material transfer device (not shown).

On frame 9 is disposed paste 7 prepared by dispersing copper-based conductive particles into a binder component including thermosetting resin such as epoxy resin or the like, hardener, organic solvent, dispersant, etc.

As concrete examples of the paste material in the present preferred embodiment are bisphenol A type epoxy resin such as epoxy resin, amine adduct hardener as a hardener, high-boiling point solvent such as butyl carbitol acetate as a solvent, and phosphoric acid ester type surfactant as dispersant.

Figure 1C:
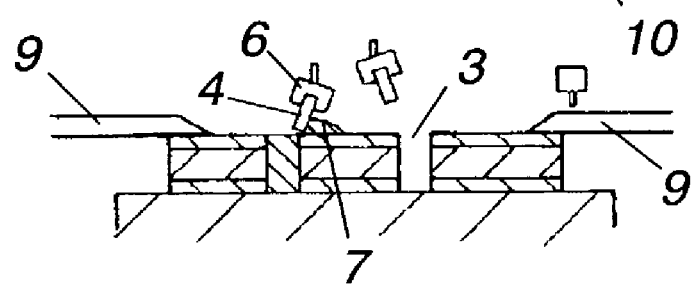

Next, as shown in FIG. 1C, the board material 1 is lightly pressed by the frame 9, and then the paste 7 on the frame 9 at left in the figure is sqeezed to the right in the figure by a forward squeegee 4 held in a squeegee holder 6 and is filled into through-holes 3.

A squeegee elevation mechanism (not shown) and a squeegee pressing mechanism (not shown) are connected to the squeegee holder 6.

Figure 1D:
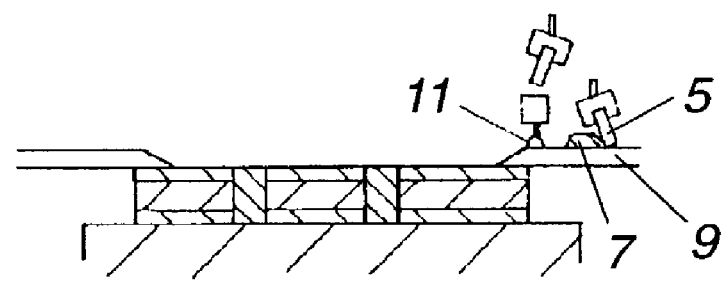

As shown in FIG. 1D, the forward squeegee 4 is changed by a backward squeegee 5 on the frame 9 at right in the figure.

At this time, sub-paste 11 is supplied onto the frame 9 at right in the figure by means of dispenser 8.

As the sub-paste 11, the paste 7 can be used without changing the composition, but as described in a conventional circuit board manufacturing method, it is more preferable to use the binder component in the paste as the sub-paste, as the binder component decreases through continuous filling operation.

In other words, the sub-paste is a composite of thermosetting resin, hardener, organic solvent, conductive particles or non-conductive particles, dispersant and the like, and the paste 7 can be used as the sub-paste, but it is possible to select a different composite and also to select at least one of the aforementioned components.

In the present preferred embodiment, a mixture of the same weight of bisphenol A type epoxy resin and an organic solvent are kneaded and used as the sub-paste 11.

Figure 1E:
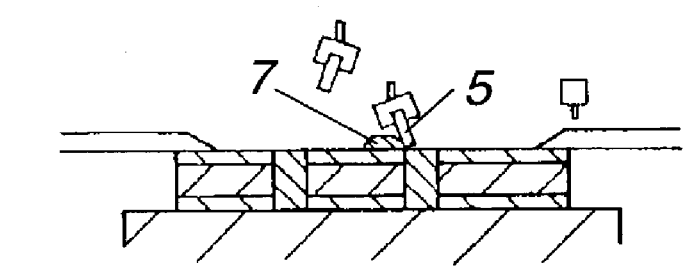

Subsequently, as shown in FIG. 1E, the paste 7 is squeezed to the left by the backward squeegee 5 and is filled into the through-hole again.

At this time, the sub-paste 11 is kneaded with the paste 7.

In the present preferred embodiment, the reason why the sub-paste 11 is supplied when the forward squeegee 4 is chnged to the backward squeegee 5 is that if it is supplied during the forward filling operation there is a possibility that the paste is filled into the through-hole 3 before the paste 7 and the sub-paste 11 are sufficiently kneaded. In that case, the filling operation is executed while the amount of conductive particles 16 is not enough as compared to the original composition of the paste 7, and it may result in insufficient quantity of conductive particles 16 filled into the through-hole 3, for example, causing an insufficient interstitial connection between the wirings in a circuit board.

Although it is possible to prevent the problem by adjusting the physical properties of the paste 7 and the sub-paste 11 or the conditions such as the speed of filling operation, it is more preferable to knead the paste during the backward filling operation by supplying the sub-paste 11 before starting the backward filling operation as described above. That is, in the backward filling operation, a sufficient amount of conductive particles 16 is already filled in the through-hole 3 during the forward filling operation, and therefore, the influence that might be caused due to backward filling operation will be very slight.

Also, it is possible to use the mixture of the paste 7 and the sub-paste 11 as a subsidiary means. For example, it is preferable to employ a method of starting the filling operation after kneading the paste by reciprocal operation in a short stroke of the backward squeegee 5 on the frame 9. Another possible example is to knead the paste precisely by installing a kneading squeegee or the like which is independent of the forward or the backward squeegee.

Figure 1F:
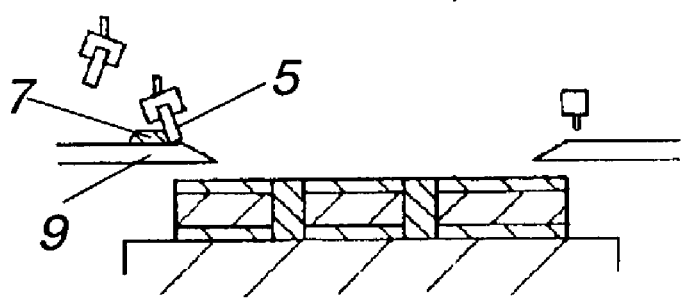

Next, as shown in FIG. 1F, the paste filling operation is completed when the paste 7 reaches the frame 9 at left in the figure, and then the frame 9 moves up and the board material 1 is ejected by a board material transfer device (not shown), thereby obtaining the board material 1 with the paste 7 filled in the through-holes 3.

As described above, according to the present preferred embodiment, when filling operation is repeated on many board materials, it is possible to prevent a phenomenon that the composition ratio between the conductive particles and binder component change to reduce the binder component in the paste.

That is, the variation from the initial composition ratio of the paste can be suppressed by supplying a sub-paste, and it is possible to solve the conventional problems such as the increase in viscosity of the paste, the insufficient filling of the paste into through-holes, or the sticking of the paste to the release film when the release film is removed.

As for the amount of the sub-paste supplyed, it is preferable to control the amount so that the paste can be kneaded by the filling operation described above, and judging from the experimental results obtained by the inventor, it is preferable to supply the sub-paste 11 at an amount of 0.1 wt % or less against the paste 7.

Further, for obtaining the effect of stabilizing the viscosity of the paste 7 by supplying the sub-paste 11, a favorable result is obtained when the amount of the sub-paste 11 supplyed is 0.001 wt % or more against the paste 7.

In the above description, the sub-paste 11 is supplied every filling operation, but it is also possible to supply the sub-paste 11 every predetermined number of board materials or to regulate the amount of the sub-paste 11 supplied in accordance with the conditions such as a total number of through-holes 3 formed in the board material 1, a total sum of each hole area, the viscosity of the paste 7 loaded onto the equipment at the initial stage of filling operation, or the viscosity of paste 7 during the filling operation or before and after the filling operation. These controls can further stabilize the viscosity of the paste 7 in the filling operation continuously executed.

Figure 2:
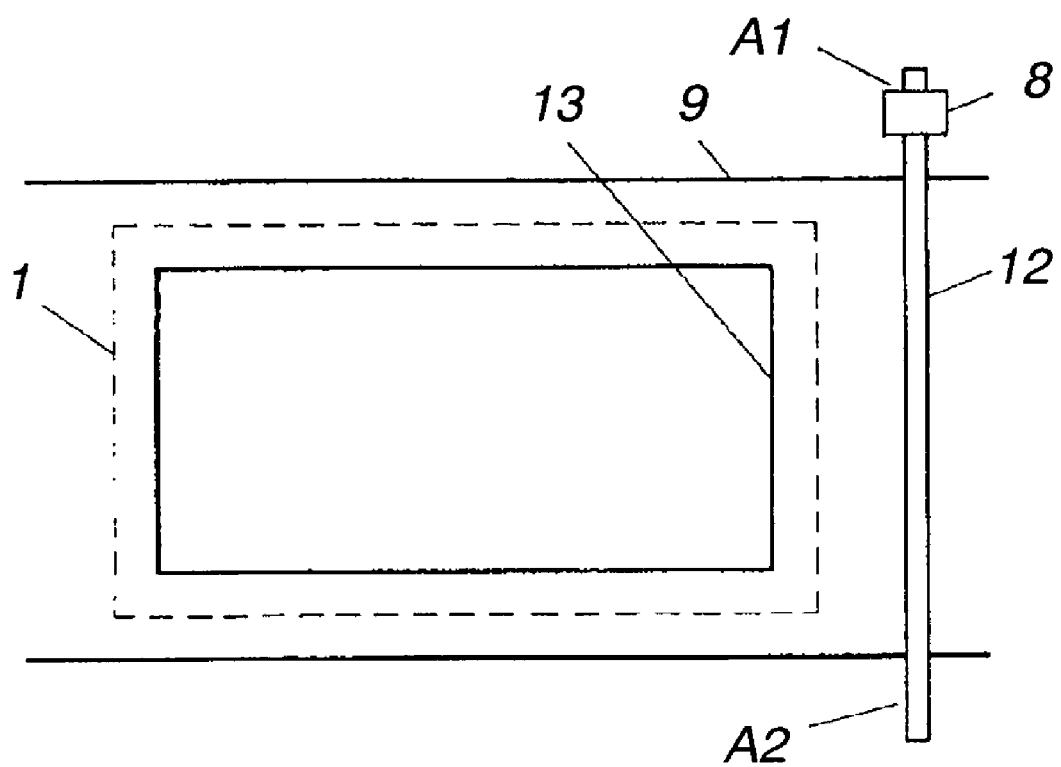
FIG. 2 is a top view showing a circuit board manufacturing apparatus in the first preferred embodiment of the present invention.

FIG. 2 is a top view of a circuit board manufacturing apparatus in the first preferred embodiment of the present invention. Frame opening 13 provided in the frame 9 is disposed so as the frame 9 hold down the peripheral portion of the board material 1.

Dispenser 8 is attached to a dispenser moving guide 12 and is moved by a driving means (not shown) from position A1 to position A2 shown in FIG. 2 to dispense the sub-paste onto the frame 9 generally linearly. As the method of dispensing, it is possible to continuously dispense linearly or to intermittently dispense a plurality of dots.

Second Preferred Embodiment

Figure 3:
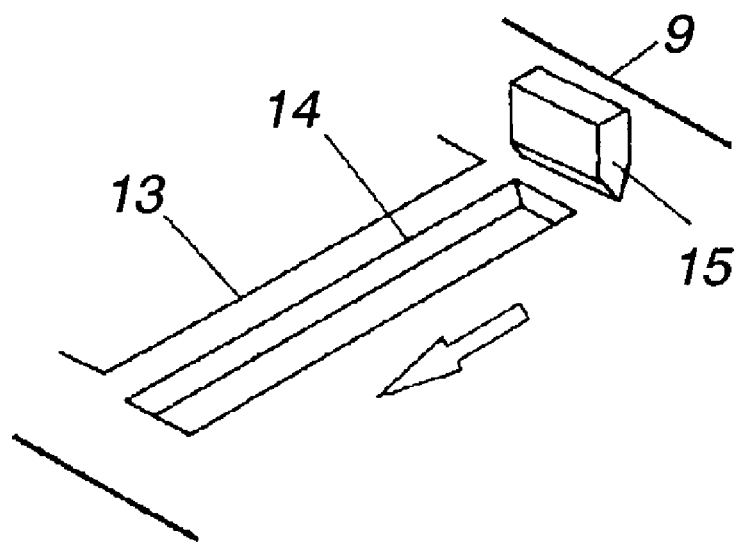
FIG. 3 is a perspective view showing a part of a circuit board manufacturing apparatus in a second preferred embodiment 2 of the present invention.

FIG. 3 is a perspective view showing a part of a circuit board manufacturing apparatus in the second preferred embodiment of the present invention. A recessed portion 14 is formed in the frame 9.

Sub-paste 11 is dropped by a dropping means (not shown) onto the recessed portion 14, and the sub-paste 11 can be filled into the recessed portion 14 by means of a layer forming squeegee 15 being contacted on the frame and moved to a direction of an arrow in the figure.

The dropped amount is preferable to be nearly the same with or larger than a volume of recessed portion 14, and the necessary amount of the sub-paste 11 can be precisely controlled by the volume of recessed portion 14.

Also, a chamfered edge-free shape of recessed portion 14 is preferable in order to avoid wearing of the squeegee.

It is also possible to control the dropping amount of the sub-paste by using other similar method. In that case, the amount is preferable to be less than the volume of the recessed portion 14.

Figure 4:
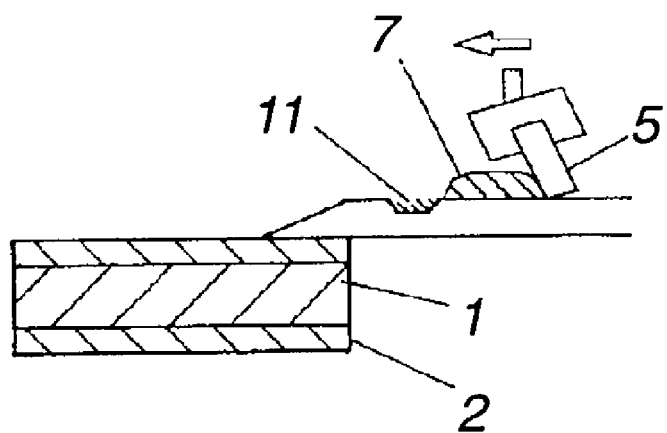
FIG. 4 is a partially enlarged sectional view of a circuit board manufacturing apparatus in the second preferred embodiment of the present invention.
Figure 6:
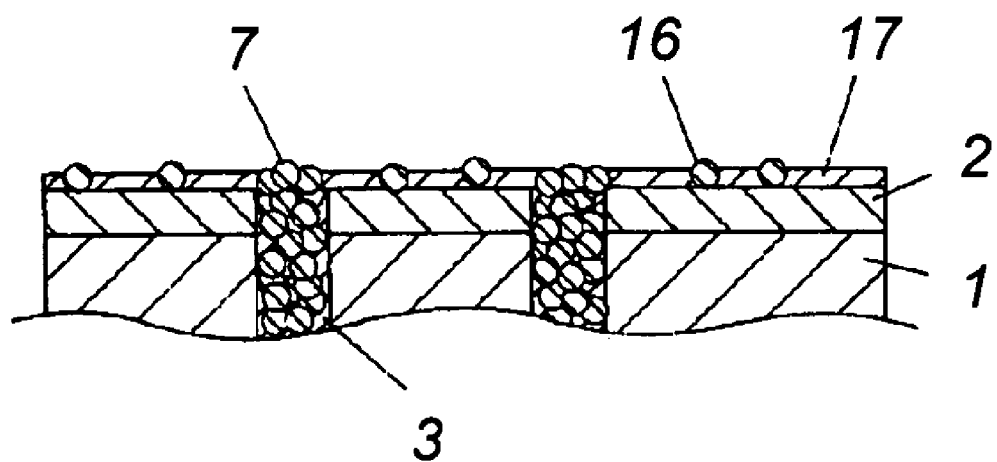
FIG. 6 is an enlarged sectional view of a board material for a conventional circuit board.

FIG. 4 is a partial sectional view showing a circuit board manufacturing method and apparatus in the second preferred embodiment of the present invention. FIG. 4 shows a state of operation based on the above configuration: after the sub-paste 11 is filled into the recessed portion 14, when the backward squeegee 5 moves to a direction of an arrow in the figure while squeezing the paste 7, the sub-paste 11 is supplied to the paste 7, and kneaded by the squeezing operation.

In the first preferred embodiment and the second preferred embodiment of the present invention, examples of filling the paste into the through-holes has been described, but the present invention is also effective to a method of filling the paste into blind-holes in board materials in a buildup process.

Also, the present invention may be employed in a process wherein nonconductive paste is filled into through-holes or blind-holes making interstitial connection by thin metal film formed by metal-plating or the like without using conductive paste.

INDUSTRIAL APPLICABILITY

The circuit board manufacturing method and manufacturing apparatus of the present invention comprises a hole forming process where through-holes or blind-holes are formed in a plate-form or sheet-form board material, and a paste filling process where a paste is filled into the through-holes or the blind-holes formed in the hole forming step, wherein sub-paste whose composition is tha same as or different from the paste is supplied to the paste by using a paste supplying means in the filling process. According to the present invention, it is possible to stabilize the viscosity of the paste and to improve the state of the paste filled in the through-hole or the blind-holes and further to prevent the paste from creeping out from the board material during the later process. As a result, it is possible to produce a circuit board having excellent reliability and to increase an utilization efficiency of the paste in the filling process by improving the continuous printability of the paste, thereby contributing to the reduction of circuit board manufacturing costs.

The invention claimed is:

1. A method of manufacturing a circuit board comprising:
   bonding release films to both surfaces of a board material;
   forming holes in said board material with said release films bonded on both surfaces thereof, wherein said holes are selected from the group consisting of through-holes and blind-holes;
   filling paste into said holes with a squeegee, said filling step comprising the steps of,
   filling a first paste into said holes,
   supplying a second paste to said first paste on a frame after said first paste has been filled into said holes; and
   kneading said second paste with said first paste on the frame during backward motion of the squeegee.

2. The method of manufacturing circuit board of claim 1, wherein said board material is a B staged prepreg sheet made by impregnating fabric with a resin material consisting mainly of thermosetting resin, wherein said fabric is woven fabric or non-woven fabric.

3. The method of manufacturing circuit board of claim 1, wherein said board material is one of a single-sided circuit board, double-sided circuit board and multi-layered circuit board, said board material having a metal layer for interstitial connection in said holes formed in said board material.

4. The method of manufacturing circuit board of claim 1, wherein said paste is prepared with at least one of conductive particles and non-conductive particles dispersed in main component consisting of thermosetting resin.

5. The method of manufacturing circuit board of claim 1, wherein a main component of said second paste is a thermosetting resin that is the same as the main component of said first paste.

6. The method of manufacturing circuit board of claim 1, wherein a main component of said second paste is one of a thermosetting resin that is different from a main component of said first paste and a composite prepared by mixing different thermosetting resin into the main component of said first paste.

7. The method of manufacturing circuit board of claim 1, wherein a predetermined amount of said second paste is supplied to said first paste by using a paste supplying means every predetermined number of board materials in said filling step.

8. The method of manufacturing circuit board of claim 7, wherein the predetermined amount is at least one of a predetermined amount and a calculated amount, said calculated amount being calculated from one of a total number of said holes and a total sum of each area of said holes.

9. The method of manufacturing circuit board of claim 8, wherein said board material is provided with a specific marking determined by at least one of said total number of said holes and said total sum of each area of said holes.

10. The method of manufacturing circuit board of claim 1, wherein an amount of said second paste varies according to an amount of said first paste which varies in accordance with a paste filling frequency to a plurality of said board materials.

11. The method of manufacturing circuit board of claim 1, wherein in the filling operation of said paste, said second paste is supplied to said first paste according to one of every predetermined number of board materials and a predetermined amount, said predetermined amount being calculated from a viscosity of said first paste measured by a viscosity measuring means.

12. The method of manufacturing circuit board of claim 1, further comprising a step of supplying said second paste on a frame using a paste supplying means, said frame covering an entire periphery or a part thereof of said board material, in said filling step,.

13. The method of manufacturing circuit board of claim 1, wherein said second paste is supplied to said first paste on a frame by using a paste supplying means.

14. The method of manufacturing circuit board of claim 1, wherein a filling operation in said filling step includes at least one reciprocal operation, and said second paste is supplied at one of a final stage of forward operation and an initial stage of backward operation in the reciprocal operation.

15. The method of manufacturing circuit board of claim 1, wherein said paste supplying means includes a dispenser unit.

16. The method of manufacturing circuit board of claim 15, wherein said paste supplying means includes a moving means which can move said dispenser unit in a direction generally orthogonal to an operational direction of filling means.

17. The method of manufacturing circuit board of claim 16, wherein said second paste is continuously or intermittently dispensed for executing generally linear supply while moving the dispenser unit by using said moving means.

18. The method of manufacturing circuit board of claim 12, further comprising a step of forming a layer of said second paste on said frame by filling said second paste into a recess having predetermined depth and disposed on said frame, said recess being included in a second paste layer forming means and said filling into said recess being performed by using a second paste supplying means and a filling/scraping means, wherein the layer of said paste is one of a continuous layer and a non-continuous layer.

19. The method of manufacturing circuit board of claim 1, further comprising a step of cleaning a portion to be supplied with said second paste.

20. The method of manufacturing circuit board of claim 1, further comprising a step of supplying one of all of decreased components and at least one specific decreased component of said paste in said filling step, compositions of said components being changed from a start of said filling operation to a supplying of said second paste.

21. The method of manufacturing circuit board of claim 1, wherein an amount of the second paste to be supplied is in a range of 0.001 wt % to 0.1 wt % against an amount of said paste.

* * * * *

UNITED STATES PATENT AND TRADEMARK OFFICE
CERTIFICATE OF CORRECTION

PATENT NO. : 7,018,672 B2
APPLICATION NO. : 10/182632
DATED : March 28, 2006
INVENTOR(S) : Toshiaki Takenake et al.

It is certified that error appears in the above-identified patent and that said Letters Patent is hereby corrected as shown below:

On Title Page
item -- (30)    Foreign Application Priority Data

December 4, 2000   (JP)   2000-368046 --

Signed and Sealed this

Nineteenth Day of September, 2006

JON W. DUDAS
*Director of the United States Patent and Trademark Office*

UNITED STATES PATENT AND TRADEMARK OFFICE
CERTIFICATE OF CORRECTION

PATENT NO.         : 7,018,672 B2  
APPLICATION NO. : 10/182632  
DATED                 : March 28, 2006  
INVENTOR(S)       : Toshiaki Takenaka et al.

It is certified that error appears in the above-identified patent and that said Letters Patent is hereby corrected as shown below:

On Title Page  
item -- (30)        Foreign Application Priority Data

December 4, 2000   (JP)   2000-368046 --

This certificate supersedes Certificate of Correction issued September 19, 2006.

Signed and Sealed this

Second Day of January, 2007

JON W. DUDAS  
*Director of the United States Patent and Trademark Office*